United States Patent [19]

Haller

[11] Patent Number: 5,019,997
[45] Date of Patent: May 28, 1991

[54] ADAPTIVE LITHOGRAPHY ACCOMMODATION OF TOLERANCES IN CHIP POSITIONING IN HIGH DENSITY INTERCONNECTION STRUCTURES

[75] Inventor: Thoedore R. Haller, Schenectady, N.Y.

[73] Assignee: General Electric Company, Schenectady, N.Y.

[21] Appl. No.: 361,623

[22] Filed: Jun. 5, 1989

[51] Int. Cl.$^5$ .............................................. G06F 15/60
[52] U.S. Cl. ..................................... 364/488; 357/75; 364/491
[58] Field of Search ................ 357/75; 364/200, 300, 364/488, 489, 490, 491

[56] References Cited

U.S. PATENT DOCUMENTS

| | | | |
|---|---|---|---|
| 4,295,149 | 10/1981 | Balyoz et al. | 357/68 X |
| 4,613,941 | 9/1986 | Smith et al. | 364/488 X |
| 4,743,489 | 5/1988 | Hasegawa | 174/261 X |
| 4,866,508 | 9/1989 | Eichelberger et al. | 357/75 X |
| 4,901,136 | 2/1990 | Neugebauer et al. | 357/75 |
| 4,930,002 | 5/1990 | Takenaka et al. | 357/75 |

Primary Examiner—Parshotam S. Lall
Assistant Examiner—Edward R. Cosimano
Attorney, Agent, or Firm—Marvin Snyder; James C. Davis, Jr.

[57] ABSTRACT

An adaptive lithography technique for use in high density interconnect circuits compensates for displacements of chip contact pads from their ideal location by including chip contact islands in the metallization pattern and positions a via hole connecting the chip contact island to the chip contact pad where it connects to both of them. The result is simplified routing and avoidance of modifications within the metallization pattern itself to accommodate actual chip placements.

19 Claims, 6 Drawing Sheets

ADAPTIVE LITHOGRAPHY ACCOMMODATION OF TOLERANCES IN CHIP POSITIONING IN HIGH DENSITY INTERCONNECTION STRUCTURES

RELATED APPLICATIONS

This application relates to U.S. Pat. No. 4,835,704 entitled "An Adaptive Lithography System to Provide High Density Interconnect", by C. W. Eichelberger et al., which is incorporated herein by reference. The present invention provides an alternative solution to the problem solved by U.S. Pat. No. 4,835,704.

BACKGROUND OF THE INVENTION

1. Field of the Invention

This application relates to the field of high density interconnection systems, and more particularly, to the field of lithography for high density interconnect systems.

2. Prior Art

In high density interconnect systems in which a plurality of integrated circuits are bonded to a substrate and interconnected by placing a dielectric layer over the integrated circuits and the substrate, forming via holes in the dielectric layer and then forming a patterned metallization layer on top of the dielectric layer with the metallization extending into via holes to make contact to the contact pads of the integrated circuits, each metallization pattern must either be individually tailored to the exact positions of the various integrated circuit chips or an adaptive lithography system must adjust an ideal metallization pattern in accordance with the actual position of the various integrated circuit chips. In the above-identified related U.S. Pat. No. 4,835,704, this problem is solved by adaptation of an ideal metallization pattern in accordance with the actual locations of the integrated circuit chips and their pads by modifying the metallization pattern to properly connect to the contact pads. That adaptation is enabled by providing a "picture frame" around the allowed location of each integrated circuit chip in which adaptation of the metal layer takes place. In order to facilitate that adaptation, one of the design rules for the ideal metallization is that each metal path which crosses the picture frame must do so perpendicular to those edges of the picture frame which it crosses. The ideal metallization pattern over the chip is maintained with respect to the chip and thus, must be shifted and/or rotated with respect to the portion outside the picture frame in accordance with any shift and/or rotation of the chip with respect to its ideal location. The ideal metallization pattern beyond the outer edge of the picture frame is maintained with respect to the substrate, i.e. unchanged during the adaption process. Adaption to the actual chip location is accomplished by modifying the metallization pattern within the picture frame area to properly connect from the ideal metallization pattern at the outside edge of the picture frame to the shifted/rotated ideal metallization pattern over the chip. This results in the angling of conductors in the picture frame area where the chip is displaced perpendicular to or rotated with respect to the ideal direction of those connections.

I have found in adapting the "Omnicards" hybrid circuit layout program available from Task Technologies, Inc. of Rochester, N.Y., to handle the original routing of the metal conductors in the ideal metallization pattern that the requirement that all wires cross the picture frame perpendicular to the edges thereof substantially complicates the routing problem for the software, and in many cases, results in a failure to connect all nodes as is required.

It is known in the integrated circuit art to open a via hole over the center of a contact pad and to provide a contact frame (an enlarged portion of the conductive run) in the pattern of the overlying metal in order to compensate for potential misalignments between the mask which defines that overlying metal and the underlying metal to be contacted.

An alternative adaptive lithography technique which is more compatible with hybrid circuit layout programs is needed.

OBJECTS OF THE INVENTION

Accordingly, a primary object of the present invention is to provide an adaptive lithography technique which is compatible with the routing systems of hybrid circuit layout programs.

A further object of the present invention is to provide an adaptive lithography system in which the ideal metallization pattern does not need to be modified during adaptation to a particular set of integrated circuit chip actual locations.

A further object of the present invention is to provide an adaptive lithography system in which all adaptation is provided in a single via layer.

SUMMARY OF THE INVENTION

The above and other objects which will become apparent from the remainder of the specification and the accompanying drawings are accomplished in accordance with a preferred embodiment of the present invention by providing contact islands in the ideal metallization pattern which are aligned with the ideal positions of associated contact pads on the integrated circuit chip. The contact islands and the chip pads may preferably be the same size. The integrated circuit chips are bonded to the substrate with sufficient accuracy to ensure that even with the integrated circuit chip displaced from its ideal position, each contact island in the first layer of metallization has a sufficient overlap with its associated chip contact pad to accommodate a via hole connecting the chip contact island to the chip contact pad. The metallization may preferably be disposed in ideal alignment with any contact pads on the substrate. However, in the event of a systematic error in the placement of the integrated circuit chips, the first layer metallization may be offset with respect to the substrate contact pads in order to bring all substrate contact islands and substrate contact pads and all chip contact islands and chip contact pads into a sufficient overlap to accommodate each of the required via holes. The via hole is positioned on the chip contact pad in accordance with the displacement of the pad from its ideal location.

Where chip placement tolerances are sufficiently relaxed, it may be necessary to make the contact islands large enough that it becomes impossible to route other conductors between adjacent pads. In that situation, the contact islands may be disposed in a separate layer from the conductive runs of the metallization pattern and may preferably be included in either a ground plane or power plane of the high density interconnect structure.

DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
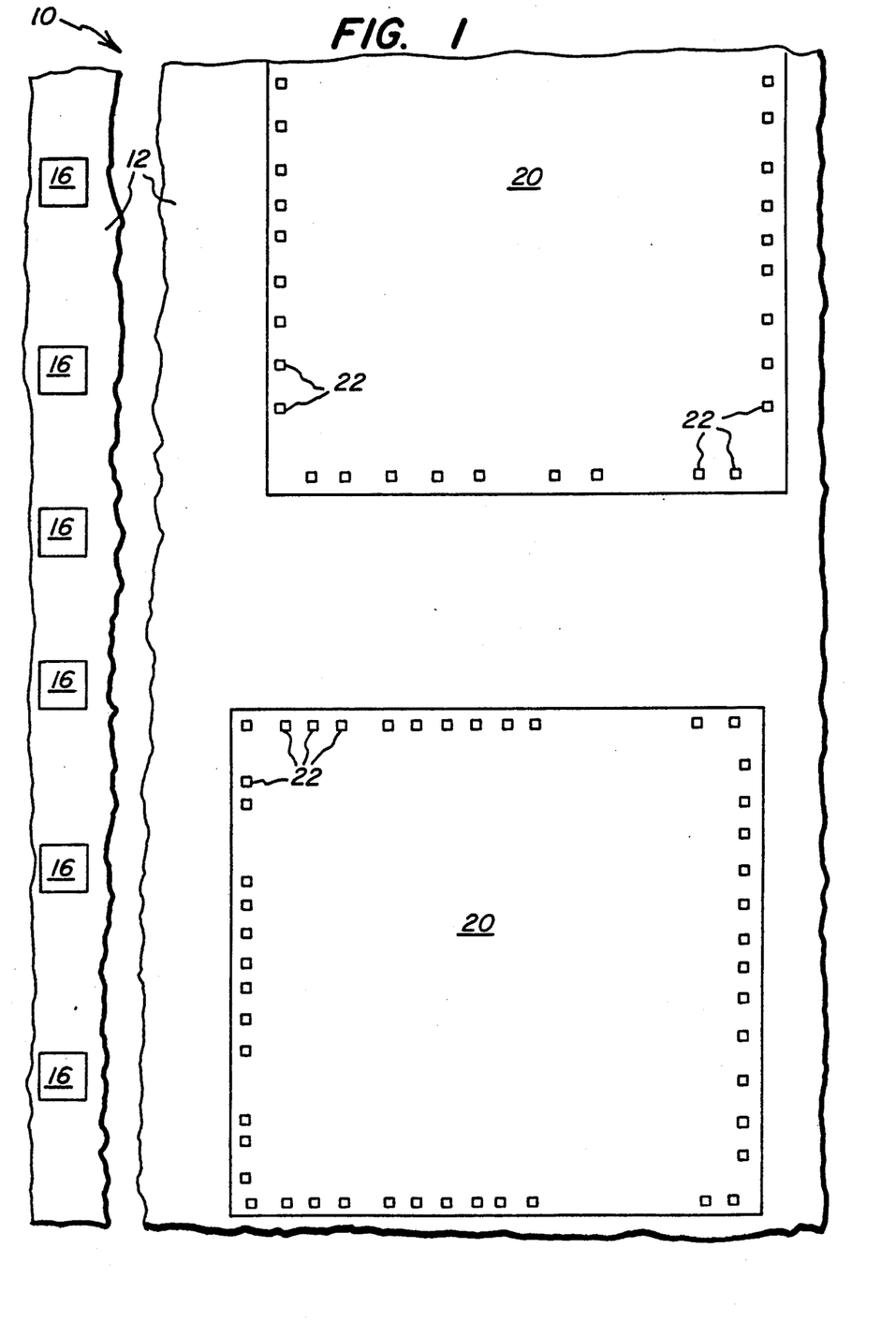
FIG. 1 is a plan view of a substrate and two integrated circuit chips and their contact pads and some substrate contact pads which are susceptible to interconnection in accordance with the present invention.

In FIG. 1, a portion of a high density interconnect circuit 10 is shown in a plan view of a substrate 12 having a plurality of substrate contact pads 16 disposed thereon and of two integrated circuits (ICs) 20 bonded thereto. Each of the integrated circuit chips 20 has a plurality of chip contact pads 22 disposed thereon. Typical pad dimensions and spacings for the integrated circuits 20 are chip contact pads 22 which are 4 mils (100 microns) square and which are located on 8 mil (200 microns) centers, i.e. contact pads 4 mils square which are separated by 4 mil spaces. The illustrated part of the structure is a small portion of the 9 ICs and 40 substrate contact pads present in the complete structure.

Figure 2:
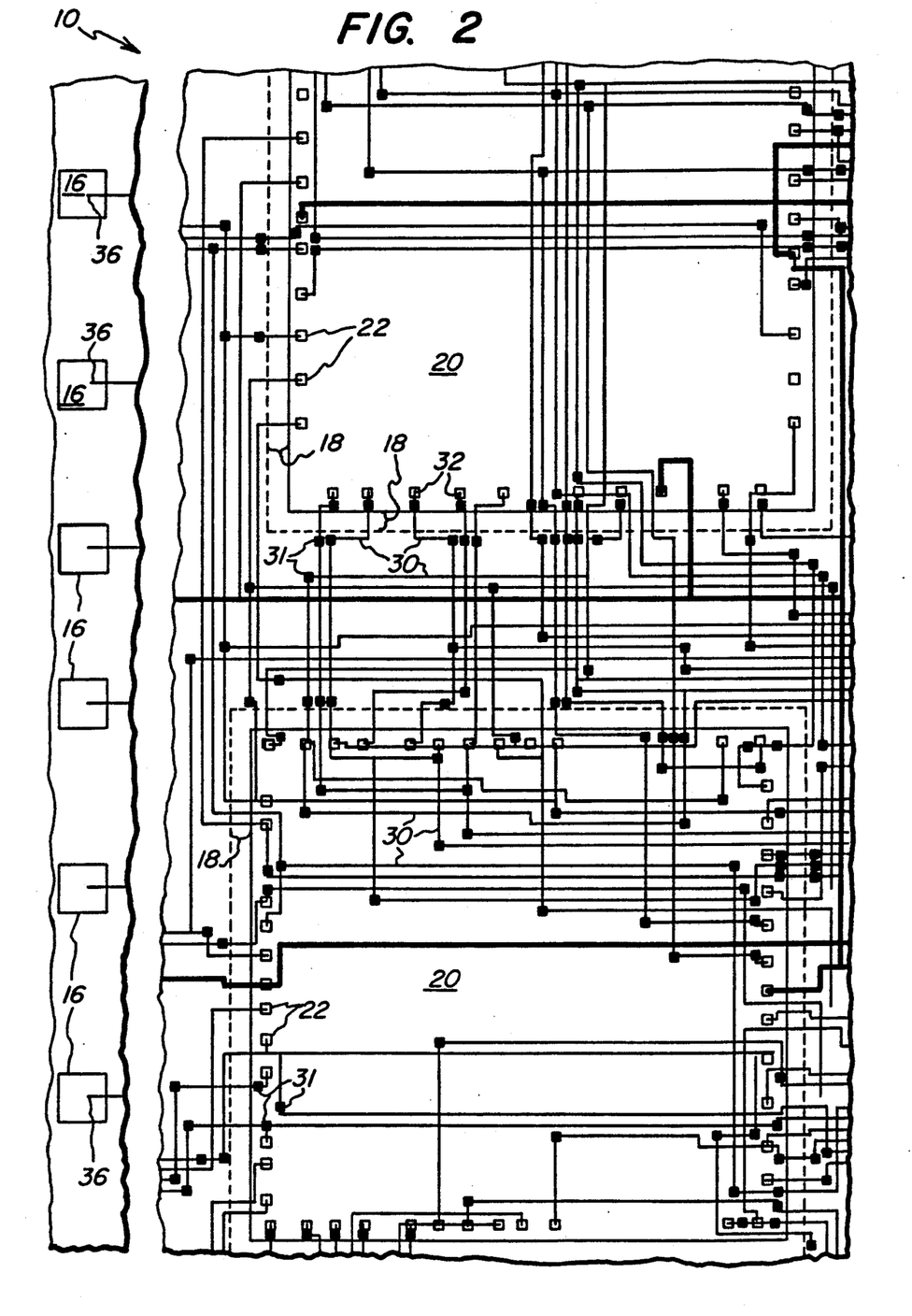
FIG. 2 is a plan view of an ideal wiring layout for the structure of FIG. 1 in accordance with the related application.

In accordance with the high density interconnect structure, after bonding of the integrated circuit chips to the substrate, a dielectric layer (not shown) is disposed over the substrate 12, the chips 20 and the contact pads 22 of the chips. FIG. 2 illustrates an ideal metallization pattern in accordance with the related application comprised of individual conductive runs 30 having vias 32 to contact pads 22 of the integrated circuit chips 20 and vias 36 for contact to the substrate contact pads 16. The wires which run horizontally in the figure are in one layer and the wires which run vertically in the figure are in a different layer and are connected where necessary through via holes in the intervening dielectric layer which are located at via pads 31.

Figure 3:
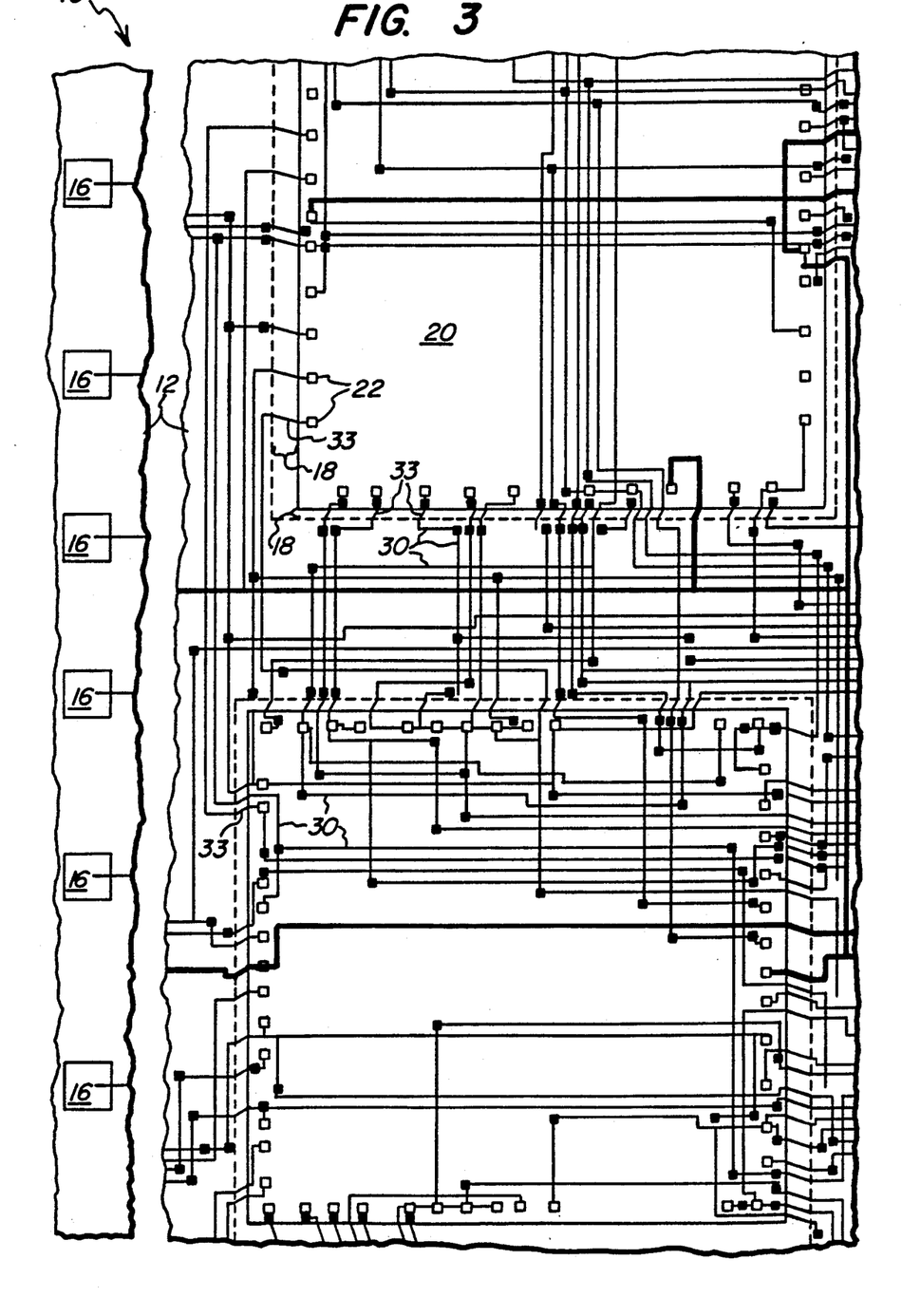
FIG. 3 is a plan view of the metallization pattern of FIG. 2 adapted in accordance with the related application for displacement of the integrated circuit chips from their ideal location.
Figure 4:
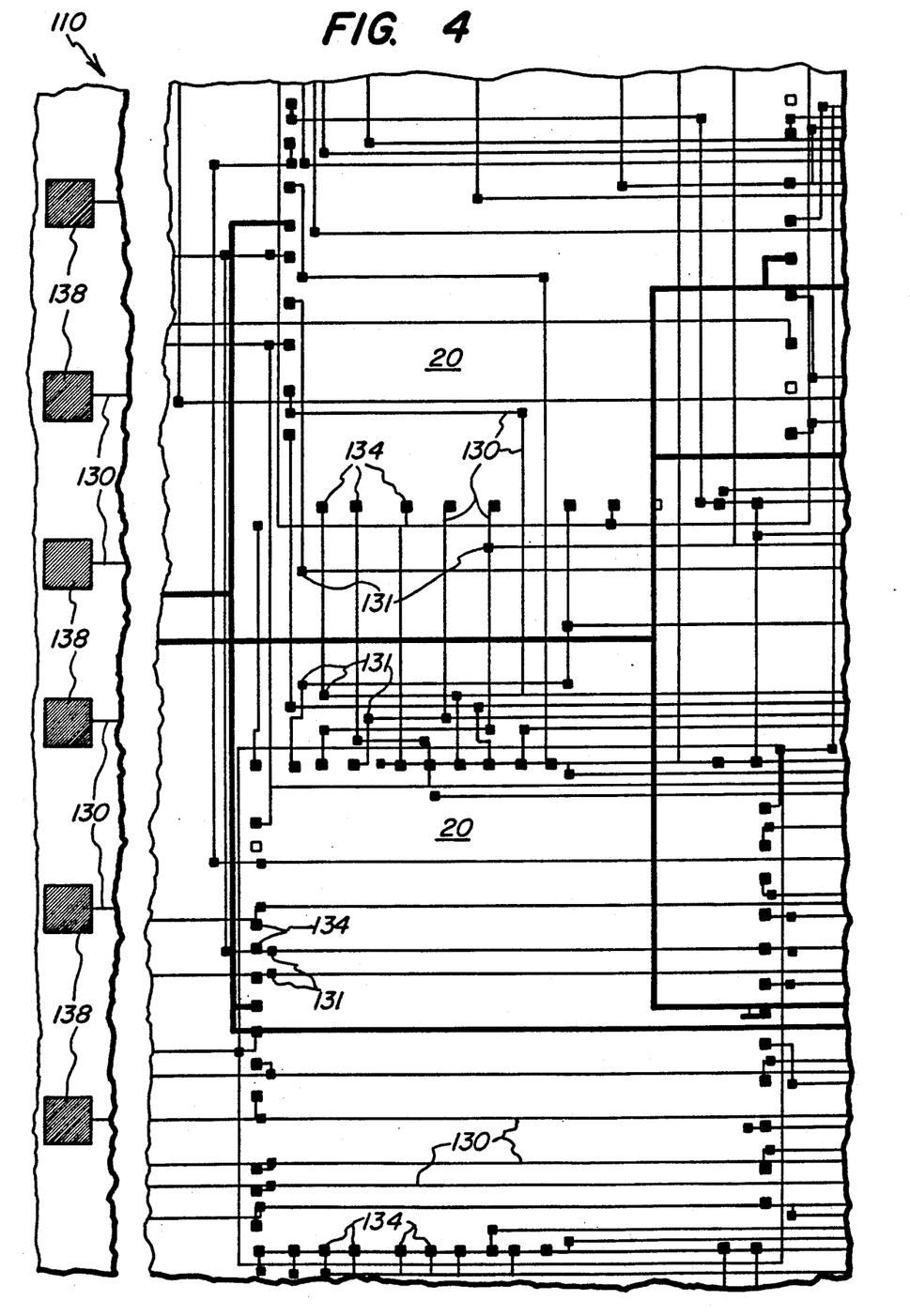
FIG. 4 is a plan view of an ideal metallization for the structure of FIG. 1 in accordance with the present invention.

In FIGS. 2-4, the via pads 31 of the conductive runs where a via hole to a different layer of metal is located (i.e. where a vertical run becomes horizontal or vice versa) are exaggerated in size as compared to the chip contact pads. These enlargements at vias are typically about 2.4 mils (0.06 mm) square and are for the purpose of ensuring that the via hole is located entirely over the underlying metal and entirely under the overlying metal. The conductive runs 30 are typically 1 mil (25 microns) wide.

A picture frame region 18 is established around each of the integrated circuit chips 20 in which adaptive modification of the ideal metallization pattern is provided to compensate for tolerances in chip placement in accordance with the related application.

The ideal conductor layout illustrated in FIG. 2 employs 200 micron (8 mil) wide picture frames. This enables the system of the related application to compensate for placement errors of up to 4 mils since the maximum tolerance on chip placement is preferably one half of the picture frame width in order to prevent adaptation of conductors within the picture frame from violating design rules on conductor spacing. Routing the ideal wiring shown in FIG. 2 required two hours of CPU time to perform the routing for the entire system using the "Omnicards" routing software and involved several unsuccessful attempts at routing which were unable to complete all routes.

After each unsuccessful routing pass, areas in the routing plane of high congestion which result in the inability to complete routes, are assigned high importance within the router. On the next routing pass, this causes the router to route as much wiring away from these high value areas as possible. That next routing pass starts from scratch in routing the conductors. Where a second routing pass is also unsuccessful, additional values are assigned in accordance with the areas of congestion and failed routing in that second pass and a third routing pass is undertaken. Eventually, a completely successful routing of this circuit was obtained. However, it required substantially more computer time than would be required without the unsuccessful or rip up passes. This long routing time is an indication that if the wiring were somewhat more complex, it would become impossible to route the circuit with two layers of interconnection—one horizontal in the figure and one vertical in the figure.

FIG. 3 is a plan view illustration similar to that in FIG. 2 in which the two illustrated integrated circuit chips are displaced from their ideal locations, the upper chip being displaced downward to the right and the lower chip being displaced upward to the left and rotated counter clockwise. In FIG. 3, conductive runs 30 have been modified within the picture frame area 18 as at 33 to properly connect the conductors of the shifted/rotated ideal pattern which is maintained in ideal alignment with the integrated circuit chips over the integrated circuit chips to the conductors of the ideal pattern which is maintained outside the picture frame 18. As has been mentioned above, I have found that the requirement that the conductors in the ideal layout cross the picture frames perpendicular to the frame edges unnecessarily complicates the process of routing the conductors in the ideal pattern when the routing is done using the Omnicards routing software. Therefore, an alternative customization or adaptation technique was needed in which the picture frame and the requirements for the conductors to run perpendicular to the edges of the picture frame within the picture frame could be eliminated.

A plan view of the same portion of the same high density interconnect structure with a metallization pattern in accordance with the present invention is illustrated generally at 110 in FIG. 4. Again, the horizontal and vertical wires in the figure are generally in different layers except for short legs which do not interfere with routing. In the FIG. 4 structure, tolerances on the placement of the integrated circuit chips with respect to their ideal locations on the substrate 12 are compensated by (1) inclusion of a chip contact island in the overlying metal layer which overlaps the chip contact pad in both the ideal position and all displaced positions of the chip contact pad which are within established placement tolerances of that ideal position and (2) by movement of the via hole which connects the chip contact pad to the chip contact island in accordance with the actual position of the chip contact pad.

The conductor routing shown in FIG. 4 required only 15 minutes of CPU time for routing the entire system using the "Omnicards" hybrid circuit router and involved no unsuccessful routing passes.

A comparison of the routings of FIGS. 2 and 4 demonstrates that the resulting routing in FIG. 4 has much less meander as well as requiring much less CPU time. Consequently, if the wiring complexity were increased somewhat in the FIG. 4 routing structure, the router would still be expected to be able to complete the routing. Thus, the adaptive lithography system in accordance with the present invention saves CPU time during the routing of the connections, produces a less complex routing and enables the system to successfully route a more complex interconnection pattern. In FIG. 4, reference numerals ending in the same two digits as reference numerals in FIG. 1, 2 or 3 refer to structures providing the same function. Those structures whose function is unchanged may not be discussed at this point and the reader is referred to the discussion in connection with FIGS. 1, 2 or 3 for an explanation of functions those structure. The pattern of the conductive runs 130 in FIG. 4 is different from the pattern of conductive runs 30 in FIG. 2. At the ends of the conductive runs 130 which are disposed in alignment with chip contact pads 22 on the underlying integrated circuit chips 20, chip contact islands 134 are provided in accordance with the present invention. In a similar manner, substrate contact islands 138 are provided at the ends of conductive runs which are disposed in alignment with contact pads 16 on the substrate 12. The substrate contact islands 138 are similar to the chip contact islands 134 except for being substantially larger.

The substrate contact pads 16 may be part of circuitry which is disposed on said substrate, may be portions of or connected to contact pads intended for wire bonding of the substrate into a larger external circuit or may comprise or be connected to edge connector contacts intended for insertion in an edge connector to connect the substrate to external circuitry, or any other appropriate conductive structure.

As noted above, typical pad dimensions and spacings for the integrated circuits 20 are square chip contact pads which are 4 mils (100 microns) on a side and which are located on 8 mil (200 micron) centers, that is, contact pads which are 4 mils square and spaced apart by 4 mils. The contact islands 134 in the conductive metallization are preferably also 4 mils (100 microns) square and spaced apart by 4 mils (100 microns). The width of the conductive runs 130 is preferably such that, without violating the design rules on spacings, a conductive run may be run between two adjacent chip contact islands 134. One specification which is preferred for the conductive runs 130 is that they be 1 mil (25 microns) wide and spaced from adjacent conductors by at least 1.5 mils (37.5 microns). This specification is met for a single conductor passing between two adjacent chip 20 contact islands for 4 mil pads on 8 mil centers.

Displacement of the chips 20 from their ideal locations is accommodated by controlling the position of the via hole which connects between a chip contact island 134 and the chip contact pad 122 disposed thereunder. This may be seen more clearly in connection with FIGS. 5-9. The via holes may preferably be square and formed by dithering of a laser in the manner taught in U.S. Pat. No. 4,894,115 by C. W. Eichelberger et al. and entitled "Laser Beam Scanning Method for Forming Via Holes in Polymer Materials". This patent is incorporated herein by reference. The actual location of the chip contact pads is preferably determined by an optical system in which reference marks on the substrate such as particular substrate contact pads or index marks are used as location reference points with respect to which the actual location of each chip and its contact pads are determined after the chips have been bonded to the substrate. This determination of any displacements of the chip contact pads from their ideal locations is preferably made prior to applying the first dielectric overlayer and is made prior to drilling via holes in the first dielectric layer in preparation for formation of the first metallization layer of the high density interconnect system. In accordance with this invention, the actual position of the chip contact pads is preferably determined after bonding of the chips to the substrate. This position determination is preferably done in accordance with the technique described in the above-identified, related, incorporated by reference U.S. Pat. No. 4,835,704 entitled, "An Adaptive Lithography System to Provide High Density Interconnect". The reader is referred to that patent for a further explanation of techniques for determining the actual location of the chip contact pads relative to their ideal position. The actual chip pad location determination is preferably done prior to application of the first dielectric layer because, in accordance with the high density interconnect system, if one of the chips is positioned out of tolerance, it may be moved to a new position within tolerance or it can be removed and it or another chip like it can be repositioned within tolerance and bonded to the substrate. Once all of the chips are positioned within the required tolerance, the first dielectric layer is applied, via holes are drilled in the proper locations and the first metal layer is applied.

Figure 5:
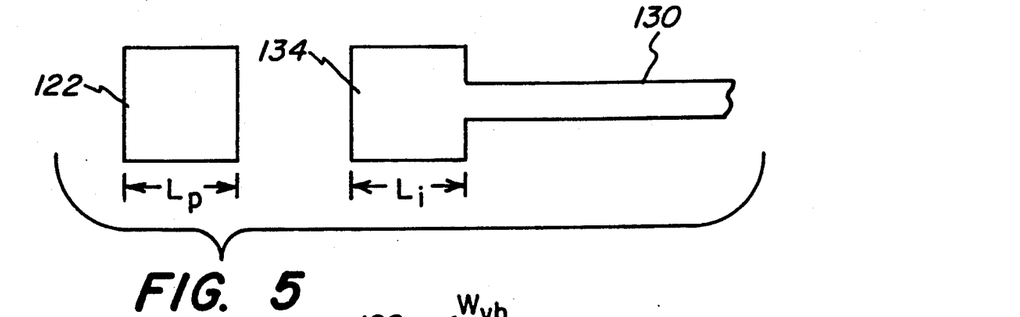
FIG. 5 is an illustration of a chip contact pad and an associated high density interconnect conductor and its associated contact island.
Figure 6:
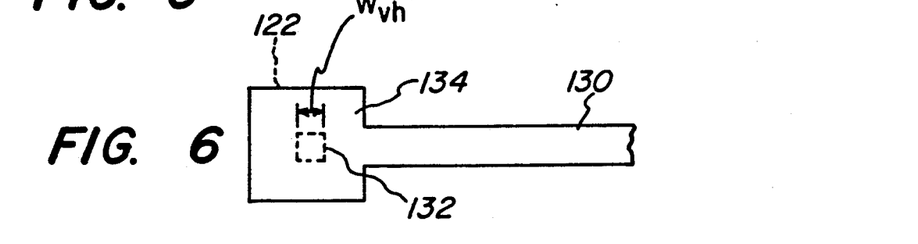
FIG. 6 is a plan view illustration of the contact island in perfect alignment with the contact pad.

In FIG. 5, a chip contact pad 122 is illustrated at the left of the figure. This chip contact pad is a square having a side length $L_p$. At the righthand side of the figure, a chip contact island 134 and conductive run 130 are illustrated. The chip contact island 134 is a square with a side length of $L_i$. In each of FIGS. 5-9 $L_p = L_i$. In each of FIGS. 6-9, the chip contact island 134 is located in the ideal position for its associated contact pad, since the overall ideal wiring pattern is preferably always positioned in its ideal location relative to the substrate except under special circumstances which are discussed subsequently, but which are not applicable here. In FIG. 6, chip contact island 134 is shown disposed over the chip contact pad 122 in their ideal alignment, that is, their alignment when the chip is positioned in its ideal location in which the chip contact island and the chip contact pad are perfectly aligned. In FIG. 6, a contact via 132 is illustrated in phantom in its ideal location in the center of both the chip contact pad 122 and the chip contact island 134. The contact via 132 may preferably be a square 1 mil on a side, but alternatively, may be circular or other desired shape. It will be noted that the via hole 132 is substantially smaller than either the chip contact pad 122 or the chip contact island 134. For chip contact pads and chip contact islands which are each 4 mils (0.1 mm) square, the via hole is preferably 1 mil (0.025 mm) square.

Figure 7:
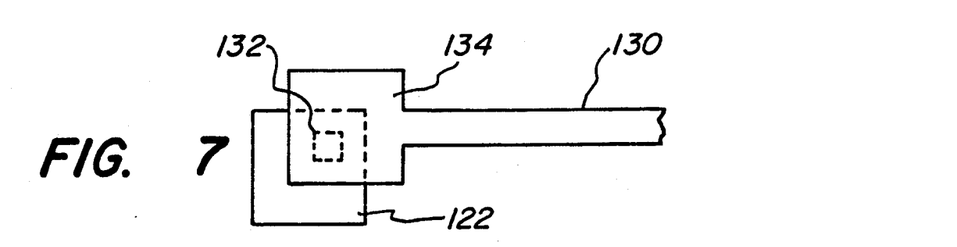
FIGS. 7-9 are plan view illustrations of the effect of displacement of the chip pad from its ideal location.

In FIG. 7, the contact pad 122 is shown displaced from its ideal location about 1 mil to the left and about 1 mil downward in the figure. The via hole 132 in FIG. 7 is displaced downward and to the left from the center of the contact island 134 and upward to the right from the center of the contact pad 122 and disposed essentially in the center of the overlap between the chip contact island 134 and the chip contact pad 122 and midway between the centers of the chip contact pad 122 and the chip contact island 134.

Figure 8:
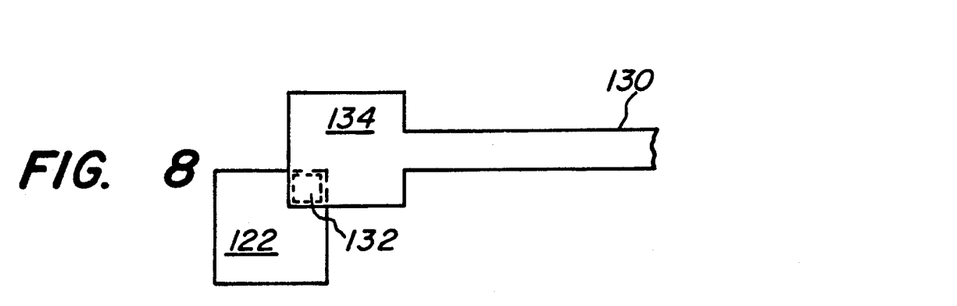
Figure 9:
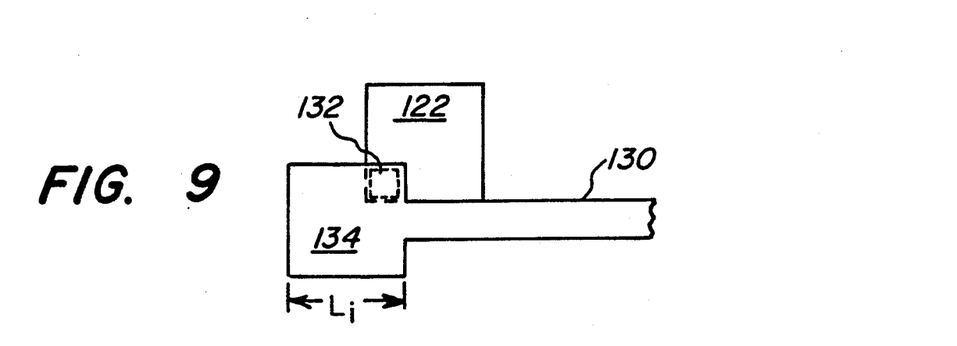

In FIG. 8, displacement of the contact pad 122 downward to the left is at its maximum extent at which the via hole 132 is still disposed in an overlap between the chip contact pad 122 and the chip contact island 134. For chip contact pads and chip contact islands which are 4 mils on a side and via holes which are 1 mil on a side, this maximum misalignment is 3 mils horizontally and 3 mils vertically in the figure. A similar misalignment in the opposite direction is illustrated in FIG. 9. Thus, this structure can accommodate differences in alignment up to 6 mils. In analytical terms, the maximum plus and minus tolerance $T_{max}$ on chip placement which may be accommodated by this metallization pattern and adaptive placement of the via holes extending between chip contact pads and chip contact islands is:

$$T_{max} = \frac{L_p}{2} + \frac{L_i}{2} - W_{vh},$$

where $W_{vh}$ is the width of the via hole.

The positions of via hole 132 are determined in accordance with the actual chip contact pad locations and the position in which the ideal first metallization layer will be positioned. The positioning accuracy of that metallization layer is much more precise than the accuracy with which a pick and place machine can, at this time, place the chip.

The present invention differs from the prior art integrated circuit framed contact technique in several respects. First, in the prior art technique, both the underlying metal pattern and the overlying metal pattern are ideal metal patterns without any localized displacements in either pattern whereas, in the present invention, each of the integrated circuits may be displaced relative to its ideal position, thus, contact is being made to a non-ideal pattern. Second, in the prior art technique, the contact frame is provided to compensate for inaccuracies in the overall alignment of the ideal second metal pattern with respect to the ideal first metal pattern whereas, in the present invention, the alignment of the second metal pattern is much more precise than the size of the features in the first level metal and the contact island is to compensate for individual displacements of the various integrated circuits from their ideal positions. Third, in the prior art, the contact frames are sized in accordance with the accuracy with which the metal pattern they form a part of can be positioned. In contrast, in the present invention, the metal layer is precisely positioned and the contact islands are sized with respect to the chip placement accuracy. Fourth, and most significant, the via holes are individually positioned on each of the chip contact pads in accordance with the direction and extent to which that chip contact is displaced from its ideal position to ensure that, with the overlying metal layer in its ideal position, the via hole will lie entirely over the chip contact pad and entirely under the chip contact island.

As an alternative to using a via hole which is smaller than the chip contact pad, a via hole the size of the chip contact pad could be used. In that way, the chip contact island would contact the chip contact pad everywhere within their overlap. Such a large via hole is not preferred because (1) its area of 16 square mils (0.01 square mm) is 16 times the area of a 1 mil square (0.000625 square mm) via hole and takes 16 times as long to make, (2) introduces the possibility of the drilled via hole extending off the chip contact pad where the laser which drills the via hole may adversely affect the structure of the integrated circuit, (3) does not eliminate the requirement for adaptation of the via hole location if it is to be aligned with the chip contact pad, (4) if the position of such a large via hole is not adapted, i.e. it is aligned with the ideal position of the chip contact pad, that assures that for any chip contact pad which is not in its ideal position, the via hole will extend off the chip contact pad. Having the via hole extend off a chip contact pad raises reliability concerns because, when the laser light which drills the via hole strikes the metal of the chip contact pad, it is substantially completely reflected, and thus does not affect the chip's structure. However, if that laser light strikes other portions of the chip, it may be absorbed and may adversely affect the structure of the chip (including its passivation). Further, extending the via hole off the chip contact pad exposes the area off the contact pad to the etchant used to clean out the via hole, raises the possibility of trapping undesired materials in the structure and may result in crazing of the dielectric.

Because the first metal layer has its ideal configuration, no adaptation is required, in subsequent metal layers or in the pattern of via holes 131 which connect those layers to the first metal layer. This simplifies both the initial routing of these higher layers and their fabrication. This is an additional advantage of this adaptation technique, since in the technique of the related application, every metallization layer and every set of via holes must be adapted in order to properly connect to wiring which overlaps the integrated circuit chips. That requires extra effort both in the original routing of the wires and in their fabrication, since a standard pattern cannot be used.

As can be seen from the figures, the substrate contact islands and the substrate contact pads are substantially larger than the chip contact pads, typically being about 25 mils (0.625 mm) in their smaller dimensions. Consequently, it is considered preferable to connect the substrate contact islands to the substrate contact pads by three via holes each. The substrate contact islands and substrate contact pads are large enough that their overlap is assured even if the metallization pattern were displaced a substantial distance from its ideal location. This enables the system to compensate for chip placement errors larger than $T_{max}$, provided that those errors involve a systematic component in the sense that the maximum contact-pad-to-contact-pad error among the integrated circuits in both the vertical and horizontal dimensions in the figures is less than $2T_{max}$ since the ideal metallization pattern can be shifted relative to its ideal position with respect to the substrate to a position in which each of the chip contact islands overlaps its associated chip contact pad to a sufficient extent to enable the via holes 132 to be drilled in locations in which they will properly connect each chip contact island to its associated chip contact pad. This displacement of the ideal metallization pattern with respect to the substrate is then compensated at the substrate contact island/substrate contact pad via connections.

Since the placement tolerance maximum $T_{max}$ is an unsigned magnitude, the placement with respect to the ideal location is ±3 mils or an overall placement accuracy of 6 mils is required. Consequently, maximum alignment tolerance is achieved by determining the position of each integrated circuit chip and its contact pads with respect to the ideal location thereof and determining the maximum displacement in the positive X-direction among the chip pads and the maximum displacement in the negative X-direction among the chip contact pads. If the difference in these displacements is less than 6 mils, then the X-direction displacement of chips can be compensated by shifting the ideal metallization pattern even if the displacement in one of the directions is greater than 3 mils. Similarly, if the maximum positive Y-direction displacement of a chip contact pad is determined and the maximum negative Y-direction displacement of chip contact pads is determined and the difference between these two values is less than 6 mils, the chip displacement from the ideal location can be compensated by shifting the ideal metallization pattern in the Y-direction, if necessary. By way of example, if the chip pad which is displaced the greatest distance in the positive X-direction is displaced only 1 mil, then a maximum chip contact displacement in the negative X-direction of 5 mils may be accommodated by shifting the ideal metallization pattern relative to the substrate. On the other hand, if the most positive X displacement were 1 mil and the most negative X displacement were 3 mils, then it would be unnecessary to displace the ideal metallization pattern in the X-direction relative to the substrate, although a displacement of 1 mil in the negative X-direction would more nearly center the chip contact islands over the chip contact pads. Similar conditions apply with respect to Y-direction displacements.

Figure 10:
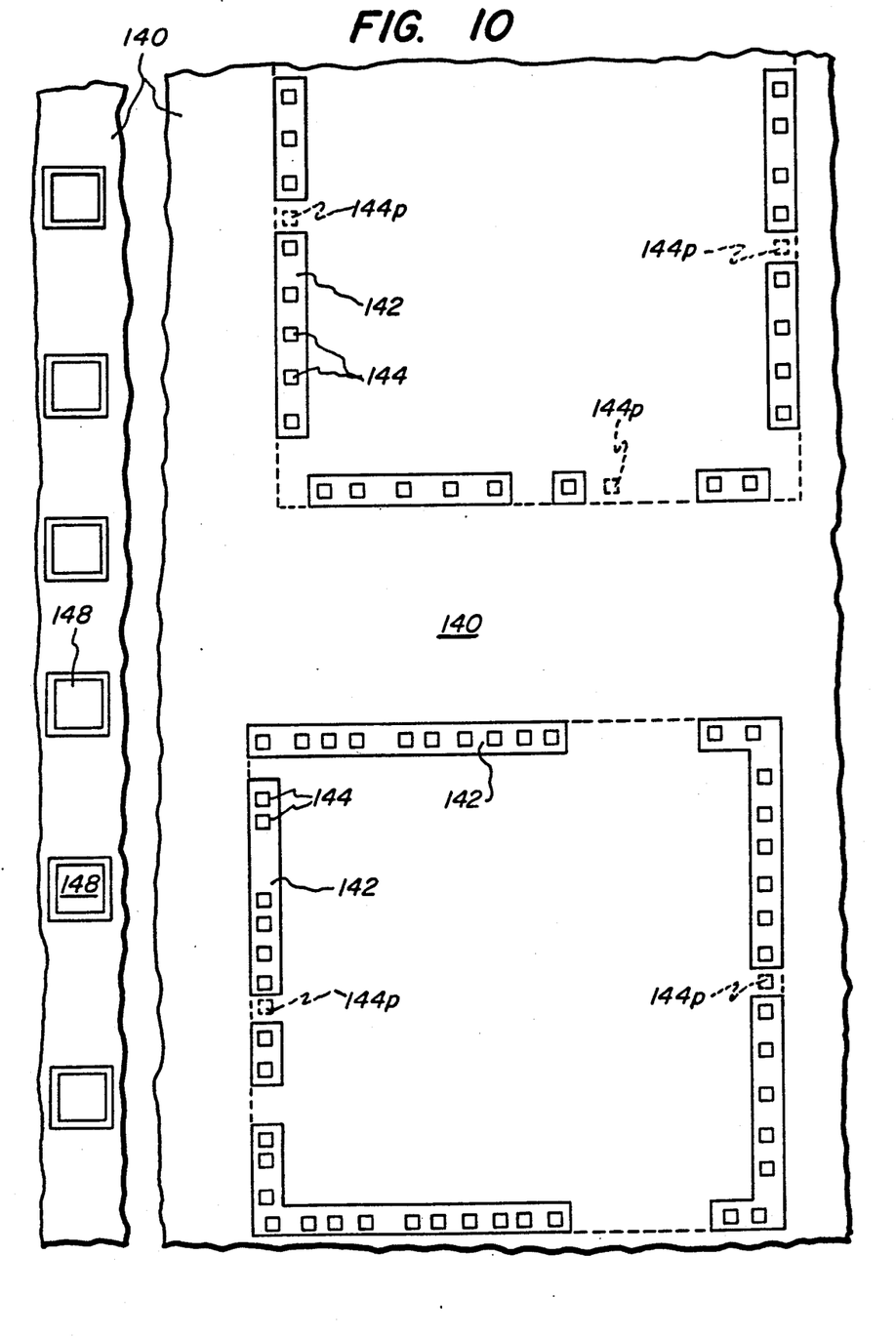
FIG. 10 is a plan view illustration of an alternative placement of chip contact islands for larger tolerances in chip placement accuracy.

If the maximum displacement of chip contact pads from their ideal location exceeds $T_{max}$, one or more chips may be removed and repositioned as has been discussed, or the size of the chip contact islands may be increased from 4 mils square to 6 mils square, thereby increasing $T_{max}$ to 4 mils and the maximum overall chip misalignment which may be accommodated to a total of 8 mils. However, this increase in island size prevents a conductive run from passing between two of the chip contact islands because the chip contact islands are then spaced apart by only 2 mils and the design rules require a 4 mil space for the passage of a conductive run. In order to provide conductive runs extending "between" the contact islands, an additional layer of metallization would be required.

Where an additional layer of metallization would be required, it is considered preferable to provide chip contact islands in a separate layer. These chip contact islands are then connected to the underlying chip contact pads by appropriately located via holes and an ideal metallization pattern is disposed in successive layers thereover. That is, the contact islands are disposed in an intermediate layer between the chip contact pads and the conductive runs of the ideal metallization. If desired, a separate contact island may still be present in the same layer as the conductive runs themselves, whereby the contact islands in the intermediate layer are intermediate contact islands. Where the high density interconnect structure already will include a ground plane or a power plane, these enlarged separate contact islands may be provided within that ground plane or power plane as illustrated in FIG. 10 where a power plane 140 has a plurality of chip contact islands 144 disposed therein with gaps 142 between the power plane itself and individual contact island which are not part of the power plane. Four power plane contact islands 144p are shown in phantom in FIG. 10. These phantom locations are where a contact island would be located in association with the other contact islands 144 in a structure which had no power plane and in which the contact island 144 were being provided in a separate layer. Substrate contact islands 148 are preferably provided in this same layer in order that all the via holes produced for a given metal layer may be of the same depth. That is, although the substrate contact islands 148 are not needed for alignment purposes, omission of them would require that via holes extending to the substrate contact island from the next higher metal layer pass through two dielectric layers. However, with the substrate contact islands present, the substrate contact islands are connected by via holes through one dielectric layer to the substrate contact pads and the next higher metal layer is connected to the substrate contact islands 148 by a via hole through a single dielectric layer.

While the invention has been described in detail herein in accord with certain preferred embodiments thereof, many modifications and changes therein may be affected by those skilled in the art. Accordingly, it is intended by the appended claims to cover all such modifications and changes as fall within the true spirit and scope of the invention.

What is claimed is:

1. In a high density interconnect circuit of the type including:
    (1) a plurality of integrated circuits each having a plurality of chip contact pads thereon and each disposed within a predetermined, non-zero, tolerance of a predetermined ideal location,
    (2) a dielectric layer disposed over said integrated circuits and their chip contact pads,
    (3) a set of conductors disposed on said dielectric layer, and
    (4) vias in said dielectric layer connecting each of selected conductors of said set to an associated one of said chip contact pads,
    the improvement comprising:
        said set of conductors having a fixed, predetermined pattern based on the ideal locations of said integrated circuits;
        each selected conductor of said set including a chip contact island at least partially overlapping its associated chip contact pad, said chip contact island being a portion of said conductor which is wider than conductive run portions of said conductor, said chip contact islands being large enough that there is sufficient overlap between each contact island and its associated chip contact pad to accommodate the via connecting the contact island and its associated chip contact pad;

each of said vias being positioned on its associated one of said chip contact pads in accordance with the direction and extent said associated one of said chip contact pads is displaced from its ideal location such that the via lies entirely under its associated one of said chip contact islands so long as each integrated circuit is disposed within said predetermined tolerance of its ideal location.

2. The improvement recited in claim 1 wherein:

some of said chip contact islands are disposed in a different layer than at least part of their associated conductive run.

3. The improvement recited in claim 1 further comprising:

an intermediate chip contact island disposed in a conductor layer disposed between one of said chip contact islands and its associated one of said chip contact islands.

4. The improvement recited in claim 1 wherein:

each of said vias has a width which is less than the width of its associated chip contact pad and its associated chip contact island.

5. The improvement recited in claim 4 wherein:

some of said vias displaced from the centers of their associated chip contact pads.

6. The improvement recited in claim 5 wherein:

there are a plurality of said vias, each of which is disposed substantially midway between the center of its associated chip contact pad and the center of its associated chip contact island.

7. The improvement recited in claim 1 wherein:

said chip contact pads are rectangular;

said chip contact islands are rectangular with their sides disposed substantially parallel to the sides of their associated chip contact pads; and said chip contact pads have a side length $L_p$ in one dimension, said chip contact islands have a side length $L_i$ in said one dimension and said vias have a width $W_{vh}$ in said one dimension, wherein:

$$\frac{L_p}{2} + \frac{L_i}{2} + W_{vh} = T_{max},$$

wherein $T_{max}$ is the maximum allowed plus and minus displacement of the center of a chip contact pad from its ideal position in said one dimension.

8. The improvement recited in claim 7 wherein:

said chip contact pads are substantially square and said chip contact islands are substantially square.

9. The improvement recited in claim 7 wherein:

$L_p$ [=] is substantially equal to $L_i$.

10. The improvement recited in claim 1 further comprising:

a substrate contact pad disposed on said substrate;

said dielectric layer being disposed over said substrate contact pad; and said set of conductors includes a second conductor disposed over said dielectric layer and connected to said substrate contact pad through a second via hole in said dielectric layer;

said second conductor including a substrate contact island at least partially overlying said substrate contact pad, where said substrate contact island portion of said second conductor is wider than interconnection run portions of said second conductor to accommodate said second via connecting said substrate contact pad and said substrate contact island.

11. The improvement recited in claim 10 wherein:

said second via has a width which is less than the width of said substrate contact pad.

12. The improvement recited in claim 11 wherein:

said second via is displaced from the center of said substrate contact pad.

13. A method of forming a high density interconnect circuit comprising:

providing a substrate and a plurality of integrated circuits, each of said integrated circuits having a plurality of chip contact pads thereon;

bonding each of said integrated circuits to said substrate within a maximum plus and minus tolerance $T_{max}$ of a predetermined ideal location;

determining the actual location of each of said integrated circuit chip contact pads relative to its ideal location;

disposing a dielectric layer over said substrate and said integrated circuits;

forming a via hold in alignment with each chip contact pad to be connected to a first overlying conductor layer with the position of each of said via holes with respect to the center of its associated chip contact pad being dependent on the location of said chip contact pad relative to is ideal location; and forming a patterned conductor layer over said dielectric layer with said conductor layer having an ideal configuration and including chip contact islands, each of which, for the ideal locations of said chip contact pads, overlies the associated one of said chip contact pads, said chip contact islands having a size which ensures that so long as said maximum tolerance $T_{max}$ is not exceeded in chip contact pad placement, each of said chip contact islands overlaps and extends into said via hole disposed over the associated chip contact pad and into contact with said associated chip contact pad.

14. The method as recited in claim 13 wherein said conductor layer includes substrate contact islands overlying substrate contact pads which are disposed on said substrate and said method further comprises the steps of:

determining a placement of said ideal conductor layer relative to said substrate which limits offset errors between chip contact islands and associated chip contact pads and substrate contact islands and associated substrate contact pads whereby each chip contact island and each substrate contact island overlaps its associated chip contact pad or substrate contact pad by at least the size of said via holes;

making said via holes in accordance with said determined offset of said ideal conductor layer and the actual locations of the associated chip contact pads; and forming said ideal conductor layer with said determined displacement relative to its ideal alignment with said substrate.

15. The method recited in claim 13 further comprising performing the following step after the step of determining:

moving an integrated circuit which is located out of tolerance to a location within tolerance.

16. The method recited in claim 15 wherein the step of moving comprises:
   removing said chip;
   repositioning said chip or one like it; and
   bonding said repositioned chip to the substrate in its new, within-tolerance location.

17. The method recited in claim 13 wherein said step of forming comprises:
   disposing said conductor layer in substantially ideal alignment with said substrate.

18. The method recited in claim 17 wherein said forming step comprises:
   positioning each of said via holes substantially midway between the ideal position and the actual location of the center of its associated chip contact pad.

19. The method recited in claim 17 further comprising the steps of:
   disposing a second dielectric layer over the first recited conductor layer;
   forming via holes in said second dielectric layer in alignment with underlying conductive material which is to be connected to a second conductor layer; and
   forming said second conductor layer in substantially ideal alignment with respect to said first recited conductor layer.

* * * * *